US007131594B2

(12) United States Patent
Ohta et al.

(10) Patent No.: US 7,131,594 B2
(45) Date of Patent: Nov. 7, 2006

(54) IC CARD

(75) Inventors: Eiji Ohta, Miyagi (JP); Osamu Ishii, Kanagawa (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 10/479,915

(22) PCT Filed: May 30, 2002

(86) PCT No.: PCT/JP02/05265

§ 371 (c)(1),
(2), (4) Date: Dec. 5, 2003

(87) PCT Pub. No.: WO02/101642

PCT Pub. Date: Dec. 19, 2002

(65) Prior Publication Data

US 2004/0169086 A1    Sep. 2, 2004

(30) Foreign Application Priority Data

Jun. 7, 2001  (JP) .............................. 2001-172267

(51) Int. Cl.
*G06K 19/06* (2006.01)
(52) U.S. Cl. ........................ 235/492; 235/487; 235/488
(58) Field of Classification Search ................ 235/492, 235/380, 487, 488; 361/737
See application file for complete search history.

(56) References Cited

U.S. PATENT DOCUMENTS 6,058,017 A    5/2000  Horejs, Jr. et al. .......... 361/737
6,404,643 B1 *  6/2002  Chung ......................... 361/737
6,412,702 B1 *  7/2002  Ishikawa et al. ............ 235/492
6,554,194 B1 *  4/2003  Sasaki et al. ................ 235/492

FOREIGN PATENT DOCUMENTS

| JP | 11-085938 | | 3/1999 |
| JP | 11353442 A | * | 12/1999 |
| JP | 2000113141 A | * | 4/2000 |
| JP | 2000-141957 | | 5/2000 |
| JP | 2000-276567 | | 10/2000 |
| JP | 2000-1076110 | | 3/2001 |

* cited by examiner

*Primary Examiner*—Steven S. Paik
(74) *Attorney, Agent, or Firm*—Sonnenschein Nath & Rosenthal LLP

(57) ABSTRACT

An IC card having high reliability, which is not only in that printing can be surely conducted with respect to the reversible display layer provided on the surface of the card substrate, but also in that the IC chip is surely protected by the reinforcing sheet. An IC card which has: an IC module (1) including an IC chip (14) mounted on an insulating substrate (11), and a reinforcing sheet (16) provided over the IC chip (14) through a sealing resin (15) for sealing the IC chip (14); a card substrate (2) comprised of a resin for sealing the IC module (1); and a reversible recording layer (3) provided on at least one surface of the card substrate (2), wherein reinforcing film patterns (13), (13') having openings (13a), (13a') which expose the IC chip (14) mounted portion are provided on at least one of the IC chip (14) mounted surface and the non-mounted surface of the insulating substrate (11).

7 Claims, 8 Drawing Sheets

IC CARD

The present application claims priority to PCT/JP02/05265 filed on May 30, 2002 and Japanese patent application 2001-172267 filed on Jun. 7, 2001.

TECHNICAL FIELD

The present invention relates to an information recording card having an information recording medium for use in an ID card (identification card), a membership card, a prepaid card, a cash card, a commuter's pass and the like, and more particularly to an information recording non-contact IC card having both recorded information of electronic data and visible information.

BACKGROUND OF THE INVENTION

In information recording card including an ID card and a credit card, magnetically or optically reading methods have been widely used. However, the techniques are popularized and the data in the cards is easily altered or forged cards are spread, and there are increasing cases where people actually suffer damage from the forged cards, causing social problems about the privacy of personal information. For this reason, in recent years, as a material for controlling personal data, an IC card having an IC chip incorporated into a substrate for card made of a resin has drawn attention since it has a large data capacity and it can contain coded data.

For exchanging information between an IC circuit and an external data processing apparatus, the IC card has a connection terminal for electrically and mechanically connecting them. Therefore, the IC card has various problems in that the airtightness in the IC circuit must be secured, an electrostatic discharge damage is avoided, a failure of the electrical connection between terminal electrodes is likely to occur, and the mechanisms of the reader/writer are complicated. In addition, a manual operation of inserting or putting an IC card into or on a reader/writer is inevitably needed, and therefore the efficiency is low or the operation is burdensome in some business. Therefore, there has been desired the development of non-contact IC cards which need no burdensome operation and which can exchange information with a portable remote data processing apparatus.

For meeting the demand, a non-contact IC card which has an antenna utilizing electromagnetic waves and an IC chip having a memory and a calculation function in a substrate for card has been developed. In this IC card, the IC is driven by the induced electromotive force excited in the antenna in the card substrate by external electromagnetic waves from a reader/writer, and no battery power source is required in the card, and thus a card having excellent activity can be provided. According to applications, attempts are made to incorporate a thin battery, such as paper battery, into the card to enlarge the communication distance or to utilize higher frequency bands, but, from the viewpoint of reduction in the cost and widening applications, cards requiring no battery are strongly desired.

For recording information onto these cards, digital recording is conducted by a recordable IC chip provided on part of the card. For display or reading of the data recorded on the card, it is necessary to read the recorded data by means of a special reading apparatus, and therefore general users cannot read the data by themselves. For example, in membership cards in which a high premium or a point is put on members, information by an information note or the like is separately required if it is merely recorded onto the card. Therefore, demands of easy display of the recorded data are increasing.

For meeting the demands, technique has been developed in which a reversible display layer (for example, reversible heat-sensitive recording layer; hereinafter, referred to simply as "heat-sensitive recording layer") is provided on the surface of the card substrate wherein the reversible display layer is of a polymer/low-molecule-type and includes an organic low molecule dispersed in a resin binder, and achieves display by utilizing the opaque-transparent contrast. The polymer/low-molecule-type reversible display medium is constituted by a support, e.g., a plastic sheet/colored layer/recording (polymer/low-molecule) layer/protecting layer.

Further, recently, for reducing the cost, a bare chip mounting method is attempted in which an IC chip is directly mounted on the card by providing an electrode portion for connecting an antenna to the IC chip on a sheet-form insulating substrate. In this case, a face down bonding method is employed in which a protrusion called bump is formed from solder or gold on an electrode portion on the circuit-formed surface of the IC chip, and connection is made to the electrode portion through the bump. The connection is made for filling the gap between the IC chip circuit surface and the insulating substrate with an an isotropic conductive film, a resin containing conductive particles, such as an anisotropic conductive resin, or under filling material.

By the way, in the IC cards, for securing reliability of the IC chip operation, the IC chip is protected by a sealing resin having a hardness different from that of the card substrate. Further, for avoiding an accident that the IC chip is mechanically broken leading to lose all data, a task is to improve the IC card in mechanical strength with respect to bending and a point pressure caused by impact at a point or the like. For achieving the task, a structure such that a reinforcing sheet is provided on the sealing resin to prevent the connection portion of the IC chip or the IC chip itself from being broken is considered.

A general process for producing the IC card is conducted in accordance with, for example, the following procedure. First, a resin sheet is printed by a known printing method, such as offset printing, gravure printing, or screen printing, and protecting sheets comprised of a thin film resin having high transparency are laminated on both surfaces of the printed resin sheet. Then, an IC module is disposed between these sheets and they are integrated by hot melting by means of a hot press, and punched out using a die having a predetermined size into a card form. Then, the card is embossed to make characters called embossed characters, and supplied to users.

However, the above-mentioned IC card having a reinforcing material poses the following problem. Specifically, when the reinforcing sheet and the sealing resin having a cure shrinkage behavior are used in combination, the reinforcing sheet deforms due to the cure shrinkage of the sealing resin. For this reason, when the IC module having the reinforcing sheet disposed on the IC chip sealed by the sealing resin is sealed between the resin sheets (card substrate), the deformation of the reinforcing sheet cannot be satisfactorily cancelled by the card substrate, so that the surface of the card substrate may become uneven.

In the card substrate having an uneven surface, when a printing operation is conducted with respect to the heat-sensitive recording layer, a spacing is caused between the heat-sensitive recording layer and a thermal head, so that the heat-sensitive recording layer cannot be satisfactorily heated, leading to a problem that missing of image recording is likely to occur.

An object of the present invention is to provide an IC card which can surely protect the IC chip by a reinforcing sheet while securing surface flatness of the card substrate, thus making it possible to surely achieve printing with respect to the reversible display layer provided on the surface of the card substrate.

SUMMARY OF THE INVENTION

For achieving the object, the present invention provides an IC card which has: an IC module including an IC chip mounted on an insulating substrate, and a reinforcing sheet provided over the IC chip through a sealing resin for sealing the IC chip; a card substrate comprised of a resin for sealing the IC module; and a reversible display layer provided on at least one surface of the card substrate, the IC card being characterized in that a reinforcing film pattern having an opening which exposes the IC chip mounted portion is provided on at least one of the IC chip mounted surface and the non-mounted surface of the insulating substrate.

In this IC card, providing a reinforcing film pattern having an opening which exposes the IC chip mounted portion on the insulating substrate for the IC module, the insulating substrate around the periphery of the IC chip is reinforced without increasing the height of the IC module. Thus, the reinforcing sheet hardly deforms due to cure shrinkage of the sealing resin for sealing the IC chip. For example, in the card substrate comprised of hot-press laminated thermoplastic sheets having the IC module disposed therebetween, even when the sealing resin undergoes a temperature higher than its glass transition temperature during the hot-pressing, the reinforcing sheet hardly deforms. Therefore, in the card substrate sealing the IC module, flatness of the surface including portions around the IC chip mounted portion is secured. Thus, surface flatness of the reversible display layer provided on the card substrate is secured.

DETAILED DESCRIPTION OF THE PRESENTLY PREFERRED EMBODIMENTS

Hereinafter, the embodiments of the present invention will be described in detail with reference to the accompanying drawings.

Figure 1:
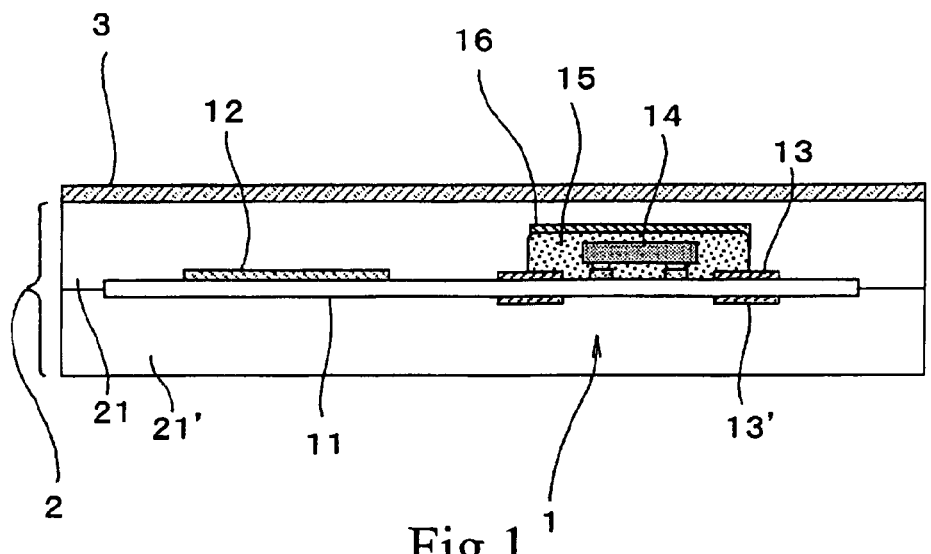
FIG. 1 is a cross-sectional view showing a structure of one example of the IC card of the present invention.
Figure 2:
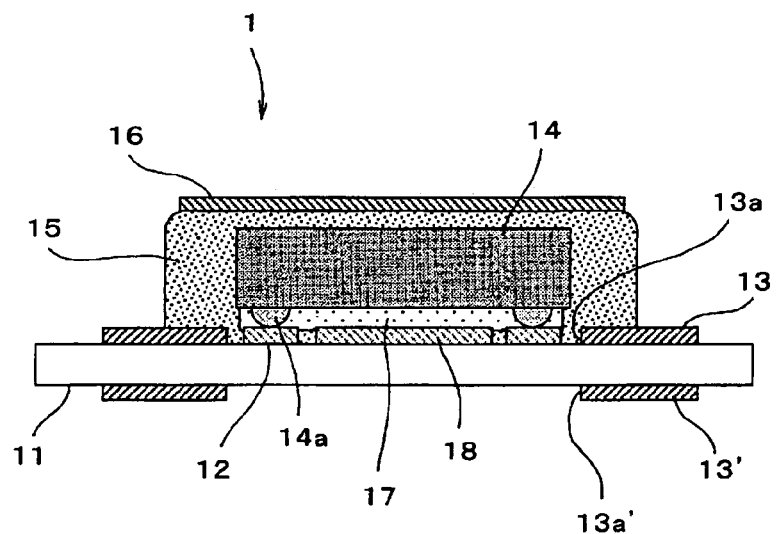
FIG. 2 is a cross-sectional view of an important portion of an IC module in the present invention, showing one example of structure.

FIG. 1 is a cross-sectional view showing one example of an IC card of the present invention, and FIG. 2 is an enlarged cross-sectional view of the important portion of the IC module constituting the IC card. First, the structure of an IC card according to one embodiment is described with reference to these figures.

The IC card shown in these figures comprises an IC module 1, a card substrate 2 which encapsulates the IC module 1, and a reversible recording layer 3 provided on at least one surface of the card substrate 2.

The IC module 1 is constituted with an insulating substrate 11 as a base material, and a circuit pattern 12 constituting an antenna or the like that is formed on one primary surface of the insulating substrate 11. Reinforcing film patterns 13, 13' are provided on at least one surface (both surfaces in the present embodiment) of the insulating substrate 11. The unique structure in the present invention resides in the reinforcing film patterns 13, 13'. An IC chip 14 is mounted on the surface of the insulating substrate 11, on which the circuit pattern 12 is formed so as to connect to the circuit pattern 12.

Further on the insulating substrate 11, a sealing resin 15 is provided to encapsulate the IC chip 14, and a reinforcing sheet 16 is provided over the entire top surface of the IC chip 14 through the sealing resin 15.

Next, structures of the individual members in the IC card having the above structure will be described in detail.

First, the insulating substrate 11 as a base material for the IC module 1 is comprised of a single material, e.g., polyimide; polyester, such as polyester, polyethylene terephthalate, or polyethylene naphthalate; polyolefin, such as polypropylene; cellulose, such as cellulose triacetate or cellulose diacetate; a vinyl resin, such as an acrylonitrilebutadiene-styrene resin, an acrylonitrile-styrene resin, polystyrene, polyacrylonitrile, polymethyl acrylate, polymethyl methacrylate, polyethyl acrylate, polyethyl methacrylate, polyvinyl acetate, or polyvinyl alcohol; or polycarbonate, or a mixture thereof, and any organic materials can be used as long as they have insulation properties.

The circuit pattern 12 formed on the insulating substrate 11 constitutes part of the circuit in the IC card.

Figure 3:
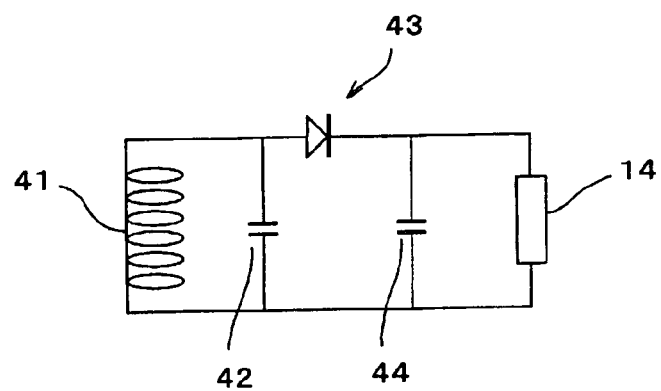
FIG. 3 is a view showing a circuit structure of the IC card.
Figure 4:
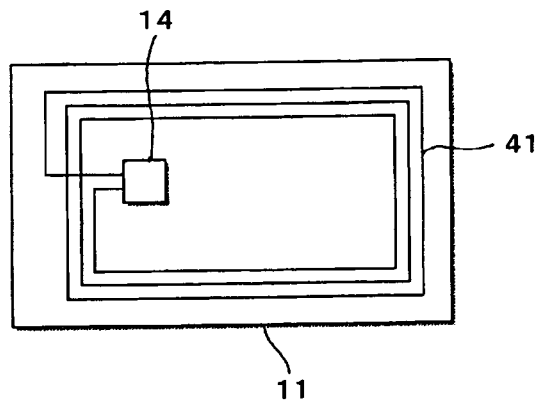
FIG. 4 is a plan view showing a structure of the IC module.

FIG. 3 shows the basic circuit configuration of the IC card. As shown in this figure, the IC card has a circuit configuration such that a rectifying diode 43, a smoothing capacitor 44, and an IC chip 14 are connected to a resonance circuit which includes an antenna coil 41 and a tuning capacitor 42. The antenna coil 41 is constituted by the circuit pattern 12 formed on the insulating substrate 11 as shown in FIG. 4, and the tuning capacitor (42), rectifying diode (43), and smoothing capacitor (44) may be either constituted by the circuit pattern 12 or mounted in the IC chip 14.

The circuit pattern 12 can be obtained by forming a conductive material layer comprised of copper, aluminum, gold, or silver on the insulating substrate 11 by, e.g., a process of plating, vapor deposition or the like, and etching the conductive material layer to form a pattern therein. Alternatively, the circuit pattern 12 may contain a large amount of conductive particles, particles treated with a conductive metal, or foil-form particles, and an organic polymer/organic low-molecular substance or its reactive substance or an inorganic adhesive material (water-glass, silicon adhesive or the like) for binding together the particles, and may be obtained by forming a pattern, in the material in accordance with a printing method (a screen printing method, an offset printing method or the like).

Further alternatively, the circuit pattern 12 in a strip form may be applied onto the insulating substrate 11 using an adhesive, or a conductive material foil may be applied onto the insulating substrate 11 using an adhesive and etched to form the circuit pattern 12. In this case, as the adhesive, a polymeric organic substance/low-molecular organic substance or a composite resin thereof may be used, and, for example, a single material of a thermoplastic resin, e.g., a polyester polyurethane resin; a polyurethane resin; a polyester resin; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, polyvinyl acetate, or polyvinyl alcohol; polycarbonate, or a mixture thereof can be used. Further, a conventionally known binder resin, e.g., a thermosetting resin, such as aphelion resin, an epoxy resin, or a silicone resin can be used. As the reactive organic low-molecular agent, a compound having at least two or more isocyanate groups (—N═C═O) per molecule or a compound having an epoxy functional group can be used, and a mixture of the compound having a reactive functional group and a compound having a functional group having reactivity, e.g., a hydroxyl group, an amino group or the like can be used without problem.

Back to FIG. 2, the reinforcing film patterns 13, 13' provided on both surfaces of the insulating substrate 11 have, respectively, openings 13a, 13a' which expose the IC chip 14 mounted portion and which are provided at positions corresponding to the periphery of the IC chip 14.

Figure 5:
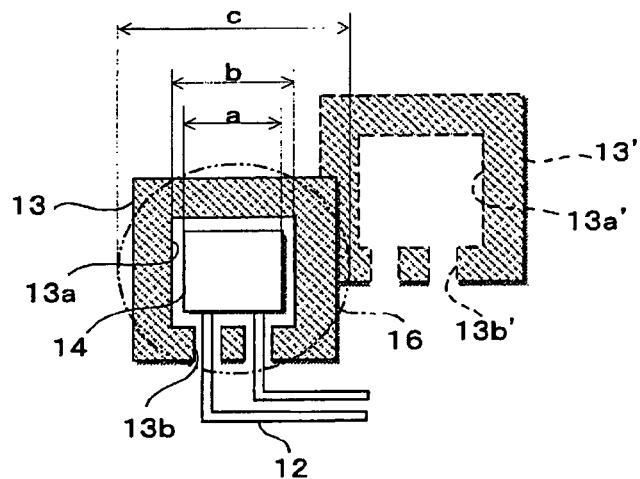
FIG. 5 is a plan view showing an example of structure of a reinforcing film pattern in the present invention.

The openings 13a, 13a' are individually larger than the IC chip 14, and the IC chip 14 is mounted in the opening 13a of the reinforcing film pattern 13 on the mounted surface. On the other hand, the reinforcing film pattern 13' on the non-mounted surface is provided so that the IC chip 14 is disposed inside the opening 13a'. The periphery of each of the openings 13a, 13a' is located inside the periphery of the reinforcing sheet 16 provided on the IC chip 14. Therefore, the forms of the openings 13a, 13a' are determined depending on the form of the IC chip 14 and the form of the reinforcing sheet 16. For example, as shown in FIG. 5, when the IC chip 14 is square and one side of the IC chip 14 is taken as "a" the openings 13a, 13a' of the reinforcing film patterns 13, 13' are individually in a rectangular form (e.g., square) having one side "b" of about (a+0.1) to (a+1) mm. In FIG. 5, for explanation, the reinforcing film pattern 13' on the non-mounted surface shifts, but actually the reinforcing film pattern 13' on the non-mounted surface is overlapped on the reinforcing film pattern 13 on the mounted surface.

Further, the reinforcing film patterns 13, 13' have an outer periphery form such that at least part of the outer peripheries of the reinforcing film patterns 13, 13' is overlapped on the outer periphery of the reinforcing sheet 16, preferably "projects" from the outer periphery of the reinforcing sheet 16 in a state such that the openings 13a, 13a', the IC chip 14, and the reinforcing sheet 16 are disposed so that their centers are aligned with one another. It is especially preferred that the outer peripheries of the reinforcing film patterns 13, 13' evenly "project" from the outer periphery of the reinforcing sheet 16. One example is as follows. When a square IC chip 14 having one side "a" of 4 mm is placed in the center of the openings 13a, 13a' of the reinforcing film patterns 13, 13' and a circular reinforcing sheet 16 having a diameter "c" of 7 mm is placed above the IC chip 14, the outer peripheries of the reinforcing film patterns 13, 13' individually have a rectangular form such that the diagonal corresponds to the diameter of the reinforcing sheet 16, more preferably a form which covers the rectangular form.

The reinforcing film patterns 13, 13' having the above-described form are comprised of a conductive material or an insulating material.

When the reinforcing film patterns 13, 13' are comprised of a conductive material, the reinforcing film pattern 13 on the IC mounted surface is patterned so that it is insulated from the circuit pattern 12. Therefore, a bypass pattern 13b is provided in the reinforcing film pattern 13 at a position in which the circuit pattern 12 connected to the IC chip 14 is formed. In this case, the reinforcing film patterns 13, 13' individually have an area possible to secure communication characteristics of the antenna constituted by the circuit pattern 12.

Especially when the reinforcing film pattern 13' on the IC non-mounted surface has a form patterned so that the film is not overlapped on the circuit pattern 12, communication characteristics of the antenna constituted by the circuit pattern 12 can be secured. Therefore, it is preferred that a bypass pattern 13b' is also provided in the reinforcing film pattern 13' at a position in which the circuit pattern 12 connected to the IC chip 14 is formed.

Figure 6:
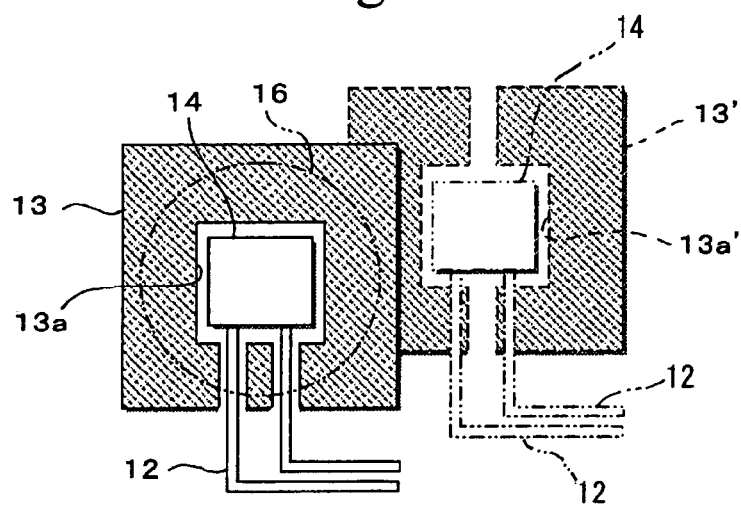
FIG. 6 is a plan view showing another example of structure of a reinforcing film pattern in the present invention.

When the reinforcing film pattern 13' on the IC non-mounted surface is comprised of a conductive material, the reinforcing film pattern 13' may have a structure such that it is divided into a plurality of portions as shown in FIG. 6. In this case, the reinforcing film pattern 13' is divided per portion to be overlapped on the circuit pattern 12 on the IC mounted surface. Specifically, when the In-part and Out-part of the circuit pattern 12 connected to the IC chip 14 are disposed on the reinforcing film pattern 13', the reinforcing film pattern 13' is divided into two portions, i.e., a portion to be overlapped on the In-part of the circuit pattern 12 and a portion to be overlapped on the Out-part of the circuit pattern 12. Thus, even when the circuit pattern 12, the insulating substrate (11), and the reinforcing film pattern 13' create a capacitor, the effect of this on the communication characteristics can be lowered, so that good communication characteristics can be obtained.

Particularly, when the reinforcing film pattern 13 on the IC mounted surface is comprised of the same material as that for the circuit pattern 12, the reinforcing film pattern 13 and the circuit pattern 12 can be formed in the same step, so that the reinforcing film pattern 13 which is a novel member can be provided without adding the number of the steps in the production process for the IC card.

On the other hand, when the reinforcing film patterns 13, 13' are comprised of an insulating film, with respect to the form of each of the outer peripheries of the reinforcing film patterns 13, 13', there is no particular limitation as long as at least part of the outer peripheries of the reinforcing film patterns 13, 13' is located outside the outer periphery of the reinforcing sheet 16 as mentioned above. Therefore, the degree of freedom for the design of the reinforcing film patterns 13, 13' can be increased. Further, in this case, a configuration of the IC mounted surface of the insulating substrate (11) may be such that the circuit pattern 12 is provided through the reinforcing film pattern 13 or the reinforcing film pattern 13 is provided over the circuit pattern 12.

Figure 7:
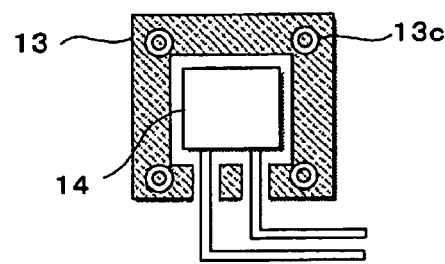
FIG. 7 is a plan view showing still another example of structure of a reinforcing film pattern in the present invention.

Further, as shown in FIG. 7, in the reinforcing film pattern 13 on the IC chip 14 mounted surface, an alignment mark 13c is preliminarily formed for use in mounting of the IC chip 14 on the insulating substrate 11 on which the reinforcing film pattern 13 is formed. The reinforcing film pattern 13 having the alignment mark 13c may be comprised of either a conductive material or an insulating material.

Further as shown in FIG. 2, the IC chip 14 includes a protruding electrode 14a provided on, for example, the surface on which the circuit is formed, and is mounted by face down bonding on the insulating substrate 11 so that the protruding electrode 14a is connected to the circuit pattern 12 through an anisotropic conductive adhesive layer 17. The anisotropic conductive adhesive layer 17 is comprised of conductive particles dispersed in an adhesive resin, and can achieve conductivity only in the thicknesswise direction.

As the adhesive resin for the anisotropic conductive adhesive layer 17, a single material, e.g., a polyurethane resin; a polyester polyurethane resin; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, polyvinyl acetate, or polyvinyl alcohol; a polycarbonate resin; or an epoxy resin, or a mixture or composite thereof can be used.

As the conductive particles dispersed in the adhesive resin, gold (Au), nickel (Ni), aluminum (Al), tin (Sn), or particles obtained by subjecting the surface of nonconductive particles, hollow particles, or foil pieces to conductivity treatment (physical or chemical treatment using Au, Ni, Al, or Sn) can be used. These conductive particles may be dispersed in the adhesive resin in a state such that they have a surface nonconductivity-treated with an organic substance or the like. In mounting of the IC chip 14, when the IC chip 14 is pressed and heated, the nonconductivity-treated layer on the surface of the nonconductivity-treated particles breaks and the conductive surface is exposed, creating an electrical connection between the IC chip 14 and the circuit pattern 12.

A supporting pattern 18 for filling the gap between the IC chip 14 and the insulating substrate 11 may be provided under the IC chip 14. The supporting pattern 18 may be formed in the same manner as in, for example, formation of the circuit pattern 12. It is noted that the supporting pattern 18 is separated from the reinforcing film pattern 13 on the mounted surface.

The sealing resin 15 provided for sealing the IC chip 14 is introduced so as to encapsulate the IC chip 14 mounted on the insulating substrate 11. As the sealing resin 15, an epoxy, silicone, or phenolic thermosetting resin can be used. For suppressing a stress on the IC chip 14 due to volume shrinkage caused by the thermosetting reaction, a single material of filler, hollow particles, or foil pieces, or a complex thereof is dispersed in the sealing resin 15. The filler, hollow particles, or foil pieces used has a size or particle size and a mixing ratio appropriately adjusted for suppressing a stress caused by shrinkage.

The reinforcing sheet 16 is provided on the sealing resin 15 so that it is bonded to the sealing resin 15. In addition, the reinforcing sheet 16 has a form such that it is surely disposed over the entire top surface of the IC chip 14 having, for example, a rectangular form as a plane figure. For example, the reinforcing sheet 16 may have a circular form having a radius larger than the maximum continuous length (i.e., diagonal length) of the plane figure of the IC chip 14, or a substantially circular form obtained by eliminating a part from this circle.

The reinforcing sheet 16 having the above individual form may be comprised of a metal material, especially preferably a material having a Vickers hardness of 200 or more. The Vickers hardness is determined in accordance with the measurement method described in JIS-Z2244, and it is a value as measured using a Vickers hardness tester specified in JIS-B7725.

Examples of materials having a Vickers hardness of 200 or higher include nonferrous metal materials, such as Cu—Sn—P, Ni—Cu—Zn, and Cu—Be—Ni—Co—Fe; nickel alloy materials, such as Ni—Co, Ni—Cr, and Ni—Mo—Cu; nickel-iron alloy materials, such as Ni—Fe; titanium, molybdenum, and stainless steel materials, such as SUS304, SUS301, SUS316, SUS316, SUS631, ASL350, SUS430, and SUS420; and carbon steel, such as SK materials, and materials having further improved hardness obtained by subjecting the above material to thermal treatment can be used.

It is desired that the reinforcing sheet 16 comprised of the above material has a thickness of 25 μm or more, and for obtaining an IC card having a thickness which falls in the range specified in ISO (760±80 μm), it is desired that the upper limit of the thickness of the reinforcing sheet 16 is 100 μm. When the thickness of the reinforcing sheet 16 falls in this range, the reinforcing sheet 16 having the form and size specified as mentioned above hardly deforms and has a satisfactory strength.

Figure 8:
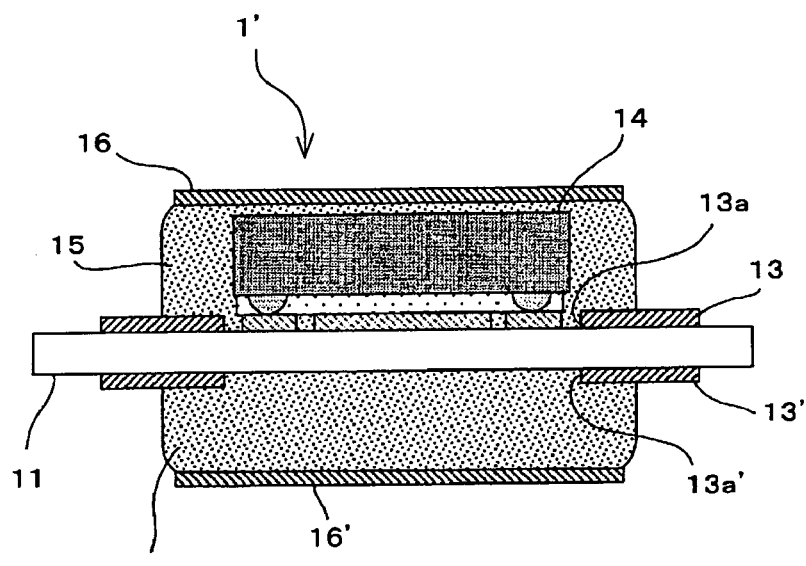
FIG. 8 is a cross-sectional view of an important portion of the IC module in the present invention, showing another example of structure.

In the above explanation, the IC module 1 has a structure in which the reinforcing sheet 16 is solely disposed on the IC chip 14 mounted surface of the insulating substrate 11, but the structure of the IC module is not limited to this and a structure may be such that a reinforcing sheet 16' is further provided on the IC chip 14 non-mounted surface of the insulating substrate 11 through the sealing resin 15' as shown in FIG. 8. In this IC module 1', the reinforcing sheet 16' provided on the non-mounted surface is disposed on the back surface of the substrate at a position corresponding to the IC chip 14 so as to be back to back with the reinforcing sheet 16. The reinforcing sheet 16' may have the same form as the form of the reinforcing sheet 16 provided on the mounted surface, but they are not necessarily the same. Further, in this case, the forms and configurations of the reinforcing film patterns 13, 13' for the reinforcing sheet 16' are similar to those for the reinforcing sheet 16.

The above-described card substrate 2 shown in FIG. 1 for sealing the IC module 1 or IC module 1' (hereinafter, both are referred to as the IC module 1) includes, for example, two thermoplastic sheets 21, 21' hot-pressed together and the IC module 1 disposed between the thermoplastic sheets 21, 21'.

The thermoplastic resin sheets 21, 21' are constituted using a crystalline thermoplastic resin having a crystallinity as low as 5% or less, and they may be individually comprised of either the same material or different materials, and may be individually comprised of either a single layer or a laminate of the same or different materials. Particularly, as the thermoplastic resin sheets 21, 21', a single material of a amorphous resin, e.g., a copolymer of terephthalic acid, cyclohexanedimethanol, and ethylene glycol; an alloy of the copolymer and polycarbonate; a copolymer of terephthalic acid, isophthalic acid, and ethylene glycol; an acrylonitrile-butadiene-styrene copolymer resin; a polystyrene resin; a polyacrylonitrile resin; a polyvinyl alcohol resin; a polymethyl acrylate resin; a polymethyl methacrylate resin; a polyvinyl acetate resin; or a polycarbonate resin, or a mixture thereof can be used. Instead of the amorphous resin, a double-sided amorphous sheet prepared from an amorphous resin and a crystalline resin by a co-extrusion method can be used. Further, in the low crystallinity polyester resin or another resin, an additive and a substance, such as a polymer, may be added in an amount of 50% by weight or less, preferably 15% by weight or less.

When, in addition to the reversible recording layer 3, for example, a printed layer is provided as the surface layer of the card substrate 2, the printed sheet is hot-pressed, together with the thermoplastic resin sheets 21, 21'. In this case, for improving the adhesiveness between the thermoplastic resin sheets 21, 21' and the printed sheet by hot melting, an adhesive may be used.

As a material for the printed sheet used together with the thermoplastic resin sheets 21, 21', a single material, e.g., polyimide; polyester, such as polyester, polyethylene terephthalate, or polyethylene naphthalate; polyolefin, such as polypropylene; cellulose, such as cellulose triacetate or cellulose diacetate; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, polyvinyl acetate, or polyvinyl alcohol; or polycarbonate, or a mixture thereof can be used.

As the adhesive used together with the thermoplastic resin sheets 21, 21', a single material, e.g., a polyester resin; a polyurethane resin; a polyester polyurethane resin; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, polyvinyl acetate, or polyvinyl alcohol; a polycarbonate resin; or an epoxy resin, or a mixture or composite thereof can be used.

Next, with respect to the reversible recording layer 3 provided on the surface of the card substrate 2, a printing operation is conducted by scanning a printing head on the reversible recording layer 3, and the reversible recording layer 3 is comprised of, for example, a heat-sensitive-type reversible recording layer. In FIG. 1, an example in which the reversible recording layer 3 is solely provided on the IC mounted surface is shown, but the reversible recording layer 3 may be provided on at least one surface of the card substrate 2, namely, at least one of the IC mounted side and the IC non-mounted side.

The heat sensitive-type reversible recording layer 3 can be selected from either a polymer/low-molecule-type one or a lueco compound-type one, and may be formed by a printing method, a coating method or the like so that the thickness becomes about 4 to 20 μm.

The polymer/low-molecule-type reversible recording layer 3 reversibly changes from an opaque layer to a transparent layer depending on the change in the crystal state of the organic low-molecular substance dispersed in the resin matrix. In the reversible recording layer 3 of this type, as examples of organic low-molecular substances dispersed in the reversible recording layer 3, there can be mentioned fatty acids, fatty acid derivatives, and alicyclic organic acids, more specifically, saturated and unsaturated fatty acids and dicarboxylic acids, and specific examples of saturated fatty acids include myristic acid, pentadecanoic acid, palmitic acid, heptadecanoic acid, stearic acid, nonadecanoic acid, arachic acid, behenic acid, lignoceric acid, cerotic acid, montanic acid, and melissic acid, and specific examples of unsaturated fatty acids include oleic acid, elaidic acid, linoleic acid, sorbic acid, and stearolic acid. The fatty acids, fatty acid derivatives, and alicyclic organic acids are not limited to these, and one of these or a mixture of two or more of these can be used.

As the resin matrix to be used, a single material, e.g., an acrylic resin, an urethane resin, a polyester resin, a cellulose acetate resin, a nitrocellulose resin, a vinyl chloride resin, or a vinyl acetate resin, or a mixture or copolymer thereof may be used. In addition, for controlling the range of temperatures at which the reversible recording layer 3 becomes transparent, a plasticizer for the resin, a high-boiling solvent or the like can be added in an amount of 0.1 to 20% parts by weight, based on the weight of the resin matrix. Further, for improving the reversible recording layer 3 in resistance to repeated printing and erasing, a curing agent, a crosslinking agent or the like suitable for three-dimensionally crosslinking of the resin matrix can be added in an amount of 0.5 to 10% parts by weight, based on the weight of the resin matrix.

On the other hand, the heat sensitive-type reversible recording layer 3 of a lueco compound type utilizes a reversible color reaction between the lueco compound and the color developing and erasing agent dispersed in the resin matrix. As a generally colorless or pale color lueco compound used in the reversible recording layer 3, representatively, ones which are generally used in pressure sensitive recording paper, thermal recording paper, light sensitive recording paper, electro-thermo sensitive recording paper, or thermal transfer paper, i.e., xanthene, spiropyran, lactone, fluoran, and sultone compounds having a partial skeleton, such as lactone, sultone, or spiropyran are used, but there is no particular limitation.

Specific example of lueco compounds include
3,3-bis(p-dimethylaminophenyl)-6-dimethylaminophtha-
  lide,
3,3-bis(p-dimethylaminophenyl)phthalide,
3,3-bis(1,2-dimethylindole-3-yl)-6-dimethylaminophtha-
  lide,
3-dimethylamino-6-chloro-7-methylfluoran,
3,3-bis(9-ethylcarbazole-3-yl-5)-dimethylaminophthalide,
3-dimethylamino-7-dibenzylaminofluoran,
3-diethylamino-7-chlorofluoran,
3-diethylamino-6-methyl-7-anilinofluoran,
3-piperidino-6-methyl-7-anilinofluoran, 3-(n-ethyl-n-nitrile)amino-6-methyl-7-anilinofluoran, 3-dibutylamino-6-methyl-7-anilinofluoran, and 3-(n-ethyl-n-tetrahydrofuryl)amino-6-methyl-7-anilinofluoran, and these may be used individually or in combination.

The color developing and erasing agent is a compound which reversibly emits protons utilizing the effect of heat energy and has both color developing effect and color erasing effect for the lueco compound. In other words, the color developing and erasing agent has both an acidic group comprised of a phenolic hydroxyl group or a carboxyl group and a basic group comprised of an amino group, and becomes acidic or basic due to the change of heat energy to cause the lueco compound to be colored or erased. The basic group may be present either in the form of a functional group or in the form of part of the compound. Examples of color developing and erasing agents having any one of a functional group as an acidic group and a functional group as a basic group for the color developing and erasing agent include aminobenzoic acid, o-aminobenzoic acid, 4-amino-3-methylbenzoic acid, 3-amino-4-methylbenzoic acid, 2-amino-5-ethylbenzoic acid, 3-amino-4-butylbenzoic acid, 4-amino-3-methoxybenzoic acid, 3-amino-4-ethoxybenzoic acid, 2-amino-5-chlorobenzoic acid, 4-amino-3-bromobenzoic acid, 2-amino-2-nitrobenzoic acid, 4-amino-3-nitrobenzoic acid, 3-amino-4-nitrilebenzoic acid, aminosalicylic acid, diaminobenzoic acid, 2-methyl-5-aminonaphthoic acid, 3-ethyl-4-aminonaphthoic acid, nicotinic acid, isonicotinic acid, 2-methylnicotinic acid, and 6-chloronicotinic acid. As a color developing and erasing agent having a basic group in the form of part of a basic compound, there can be mentioned salts or complex salts of a compound having a phenolic hydroxyl group or a carboxyl group and a compound having an amino group, and examples include salts or complex salts of an acid, such as a hydroxybenzoic acid, a hydroxysalicylic acid, a gallic acid, or bisphenolacetic acid, and a base, such as an aliphatic amine, a phenylalkylamine, or a triallylalkylamine. Specific examples include p-hydroxybenzoic acid-alkylamine salts, p-hydroxybenzoic acid-phenylalkylamine salts, m-hydroxybenzoic acid-alkylamine salts, methyl p-hydroxybenzoate-alkylamine salts, stearyl p-hydroxybenzoate-alkylamine salts, bisphenolacetic acid-alkylamine, and octyl bisphenolacetate-alkylamine salts, and these may be used individually or in combination. The lueco compound and the color developing and erasing agent are not limited to these, and one of these or a mixture of two or more of these can be used.

As the resin matrix, a single resin, e.g., an acrylic resin, a polyester resin, a polyurethane resin, polyurea, a melamine resin, polycarbonate, polyamide, polyvinyl pyrrolidone, polyvinyl alcohol, polyvinyl chloride, or polyvinyl butyral, or a mixture or copolymer thereof may be used. Further, for improving the reversible recording layer 3 portion in resistance to repeated printing and erasing, a curing agent, a crosslinking agent or the like suitable for three-dimensionally crosslinking of the resin matrix can be added in an amount of 0.5 to 10% parts by weight, based on the weight of the resin matrix. In addition, for improving the resistance, an ultraviolet absorber having relatively high compatibility with the lueco compound can be added.

As a method for producing an IC card having the above-described structure, a melting lamination method by means of a hot press can be used. In production of an IC card by the melting lamination method, for example, an IC module 1 is first disposed between two thermoplastic resin sheets 21, 21', and then they are together disposed between mirror plates larger than them and integrated by means of a hot-melt press. Thus, the IC module 1 is sealed into the card substrate 2. As the mirror plate used in this instance, a nickel-chromium plated copper plate, a stainless steel plate having a ground surface, or an aluminum plate having a ground surface can be used.

Next, if desired, a printed sheet obtained by printing characters or patterns on a resin sheet by a known printing method, such as an offset printing method, a screen printing method, or a gravure printing method, is prepared. Then, the printed sheet is disposed on the card substrate 2, further the reversible recording layer 3 is disposed on the printed sheet, and the printed sheet and the reversible recording layer 3 are temporarily fixed to the surface of the card substrate 2 using, for example, an ultrasonic bonding machine or the like. Then, the resultant laminate is disposed again between the mirror plates and melted together by hot-pressing.

Then, the integrated card material is peeled off the mirror plates, and punched out into a card form by means of single-edged or male-female dies to produce an IC card. Further, after being punched out into a card form, if desired, characters are embossed on the card by means of an embosser, and the embossed characters are colored by tipping using a thermal transfer foil, or magnetic information is encoded on magnetic stripes, and, if desired, a facial portrait, a barcode or the like is transferred to the card to finish the IC card. The printing for the surface of the card substrate 2 may be direct printing for the surface of the thermoplastic resin sheets 21, 21'.

Alternatively, although not shown, for providing a contact IC chip, the surface of the card substrate 2 is cut to form a recess, and then a contact IC chip is embedded in the recess using an adhesive, so that a combination or hybrid card having both a non-contact IC (i.e., IC chip 14) and a contact IC can be produced.

The thus obtained IC card has, on the insulating substrate 11 of the IC module 1, the reinforcing film patterns 13, 13' having the openings 13a, 13a' which expose the IC chip 14 mounted portion, and therefore the insulating substrate 11 around the periphery of the IC chip 14 is reinforced without increasing the height of the IC module. Thus, the reinforcing sheet 16 hardly deforms due to cure shrinkage of the sealing resin 15 over the IC chip 14. In other words, in lamination of the thermoplastic resin sheets 21, 21' by hot-pressing, even when the sealing resin 15 undergoes a temperature higher than its glass transition temperature, the reinforcing sheet 16 hardly deforms. Therefore, in the card substrate 2 sealing the IC module 1, flatness of the surface including the IC chip 14 mounted portion is secured.

Thus, while protecting the IC chip 14 by the reinforcing sheet 16 provided thereon, the surface flatness of the reversible recording layer 3 provided on the card substrate 2 can be improved. As a result, in the IC card improved in reliability, when a printing operation is conducted on the reversible recording layer 3, a spacing between the reversible recording layer 3 and the printing head is reduced to enable sure printing, thus making it possible to improve the printing properties for the reversible recording layer 3.

Figure 9:
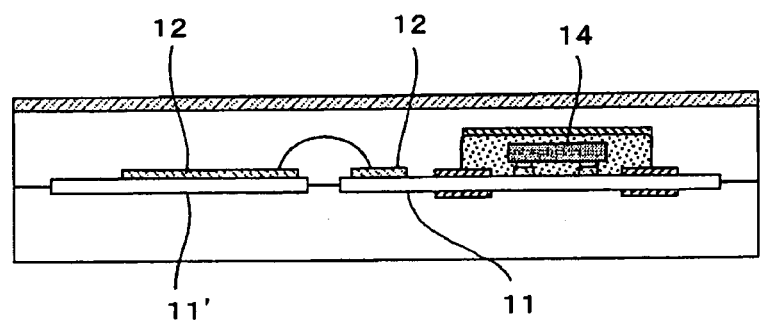
FIG. 9 is a cross-sectional view showing a structure of another example of the IC card of the present invention.

The structure of the IC card of the present invention is not limited to the structure shown in FIG. 1 in which whole of the IC chip 14 and the circuit pattern 12 are provided on the same insulating substrate 11, but may be, for example, a structure shown in FIG. 9 in which an insulating substrate 11 having mounted thereon the IC chip 14 and an insulating substrate 11' having provided thereon the circuit pattern 12 constituting an antenna or the like are individually provided, and the circuit pattern 12 on the insulating substrate 11 connected to the IC chip 14 is connected to the circuit pattern 12 on the insulating substrate 11' by wire bonding or the like. Alternatively, although not shown, a structure may be such that the insulating substrate 11 is provided with a conductive material (e.g., antenna coil) extending from the substrate. Further, in the above structures, a reversible display layer may be provided on the IC chip non-mounted surface, and the same effect can be obtained.

In the above embodiment, an explanation is made on the structure in which the card substrate 2 has two thermoplastic resin sheets hot-pressed, but the IC card of the present invention is not limited to one using the card substrate 2 having the above structure, but may be applied to one using a card substrate which has, for example, two outer sheets having an adhesive resin filled therebetween, and the same effect can be obtained. In this case, the IC module is sealed by the adhesive resin between the outer sheets.

EXAMPLES

Next, specific Examples 1 to 19 of the present invention and Comparative Examples 1 to 8 for these Examples, and the results of evaluation therefor will be described. Here, samples for evaluation (specifically, IC cards in Examples 1 to 19 and Comparative Examples 1 to 8) were produced using the forms and configurations of the reinforcing film patterns 13, 13' shown in Table 1 below as factors, and, with respect to each evaluation sample, the printing properties for the reversible recording layer 3, the communication characteristics, and the static load strength were evaluated.

| | Reinforcing film layer | | | | Evaluation | | |
|---|---|---|---|---|---|---|---|
| | On IC mounted surface | On IC non-mounted surface | Portion of reinforcing film layer on IC non-mounted surface overlapped on circuit pattern | Reinforcing sheet on IC non-mounted surface | Printing properties | Communication characteristics (mm) | IC strength (kgf) |
| Example 1 | Present | — | — | — | Δ | 93 | 8.2 |
| Example 2 | Present | Present | Present | — | ○ | 88 | 7.7 |
| Example 3 | — | Present | Present | — | Δ | 88 | 8.6 |
| Example 4 | Present (Larger than reinforcing sheet size) | — | — | — | ○ | 92 | 8.2 |
| Example 5 | Present (Larger than reinforcing sheet size) | Present (Larger than reinforcing sheet size) | Present | — | ○ | 87 | 8.4 |
| Example 6 | — | Present (Larger than reinforcing sheet size) | Present | — | ○ | 88 | 8.8 |
| Example 7 | Present | Present | None | — | ○ | 92 | 8.3 |
| Example 8 | — | Present | None | — | Δ | 93 | 8.7 |
| Example 9 | Present | — | — | Present | Δ | 93 | 12.3 |
| Example 10 | Present | Present | Present | Present | ○ | 86 | 12.6 |
| Example 11 | — | Present | Present | Present | Δ | 87 | 12.8 |
| Example 12 | Present (Larger than reinforcing sheet size) | — | — | Present | ○ | 93 | 12.6 |
| Example 13 | Present (Larger than reinforcing sheet size) | Present (Larger than reinforcing sheet size) | Present | Present | ○ | 87 | 12.2 |
| Example 14 | — | Present (Larger than reinforcing sheet size) | Present | Present | ○ | 88 | 12.7 |

-continued

| | Reinforcing film layer | | | Reinforcing sheet on IC non-mounted surface | Evaluation | | |
|---|---|---|---|---|---|---|---|
| | On IC mounted surface | On IC non-mounted surface | Portion of reinforcing film layer on IC non-mounted surface overlapped on circuit pattern | | Printing properties | Communication characteristics (mm) | IC strength (kgf) |
| Example 15 | Present | Present | None | Present | ○ | 93 | 13.1 |
| Example 16 | — | Present | None | Present | Δ | 93 | 12 |
| Example 17 | — | Present (Lager portion overlapped on circuit pattern) | Present | — | ○ | 70 | 7.8 |
| Example 18 | Present (Larger than reinforcing sheet size) | Present (Larger than reinforcing sheet size) | Present | Present | ○ | 93 | 12.6 |
| Example 19 | — | Present (Larger than reinforcing sheet size) | Present | Present | ○ | 93 | 12.5 |
| Comparative Example 1 | — | — | — | — | X | 93 | 8.3 |
| Comparative Example 2 | — | — | — | Present | X | 94 | 12.5 |
| Comparative Example 3 | Present (No opening) | — | — | — | X | 87 | 8 |
| Comparative Example 4 | Present (No opening) | Present (No opening) | Present | — | X | 85 | 9.1 |
| Comparative Example 5 | — | Present (No opening) | Present | — | X | 87 | 8.4 |
| Comparative Example 6 | Present (No opening) | — | — | Present | X | 88 | 12.9 |
| Comparative Example 7 | Present (No opening) | Present (No opening) | Present | Present | X | 85 | 13 |
| Comparative Example 8 | — | Present (No opening) | Present | Present | X | 87 | 12.6 |

Examples 1 to 8

In Examples 1 to 8, IC cards were individually produced using an IC module having the structure shown in FIG. 2 in which the reinforcing sheet 16 was solely provided on the IC mounted surface. In the IC card in each Example, an IC chip 14 having a 4 mm×4 mm form as a plane figure was provided, and a circular reinforcing sheet 16 having a diameter of 7 mm was disposed over the IC chip 14 so that their centers were aligned with one another. Further, in the IC card in each of Examples 1 to 8, reinforcing film patterns 13, 13' having the forms described below were individually provided.

Example 1

Figure 10:
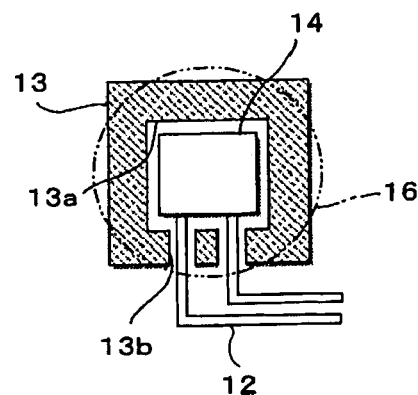
FIG. 10 is a plan view showing a form and configuration of a reinforcing film pattern in Example 1 and Example 9.

In the IC card in Example 1, there was used an IC module shown in the plan view of FIG. 10 (as viewed from the top of the reinforcing sheet 16; this applies to the subsequent figures) in which the reinforcing film pattern 13 was solely disposed on the IC mounted surface. The reinforcing film pattern 13 was formed into a square form having one side corresponding to a length shorter than the diameter of the reinforcing sheet 16 by 0.5 mm, namely, 6.5 mm×6.5 mm square outer periphery form. In addition, in the reinforcing film pattern 13, an opening 13a having a square form having one side corresponding to a length longer than the one side of the square IC chip 14 by 0.3 mm, namely, opening 13*a* having a 4.3 mm×4.3 mm square form was formed. The outer sides of the reinforcing film pattern 13 were respectively parallel to the corresponding sides of the opening 13*a*. Further, the reinforcing film pattern 13 was obtained by forming a pattern in the same conductive film as that used for the circuit pattern 12, and therefore a bypass pattern 13*b* was formed in the reinforcing film pattern 13 at a position in which the circuit pattern 12 connected to the IC chip 14 was formed so that the reinforcing film pattern 13 was surely insulated from the circuit pattern 12. The bypass pattern 13*b* had a width larger than that of the circuit pattern 12 by 0.3 mm.

The reinforcing film pattern 13 having the above-described form, the IC chip 14, and the reinforcing sheet 16 were arranged so that the IC chip 14 was non-contact mounted in the opening 13*a* of the reinforcing film pattern 13 and their centers were aligned with one another. Thus, the four corners of the reinforcing film pattern 13 are "projected" from the reinforcing sheet 16 as viewed from the top of the reinforcing sheet 16.

Example 2

Figure 11:
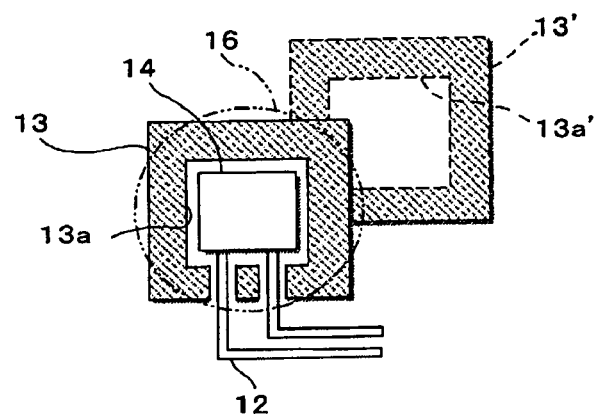
FIG. 11 is a plan view showing a form and configuration of a reinforcing film pattern in Example 2 and Example 10.

In the IC card in Example 2, there was used an IC module shown in FIG. 11 in which the reinforcing film patterns 13, 13' were respectively disposed on the IC mounted surface and the non-mounted surface. The forms and configurations of the reinforcing pattern 13 on the IC chip 14 mounted surface, and the reinforcing sheet 16 are the same as those in Example 1. The reinforcing pattern 13' on the non-mounted surface had the same outer periphery form as that of the reinforcing film pattern 13 on the mounted surface and had an opening 13*a*'. No bypass pattern was formed in the reinforcing film pattern 13' at a position in which the circuit pattern 12 was formed and a merely square opening 13*a*' was formed in the center of the square pattern in the same direction.

The reinforcing film pattern 13 having the above-described form, the IC chip 14, the reinforcing sheet 16, and the reinforcing film pattern 13' were arranged so that the IC chip 14 was non-contact mounted in the reinforcing film pattern 13 and the reinforcing film pattern 13 and the reinforcing film pattern 13' were disposed in the same direction and their centers were aligned with one another. In the figure, the reinforcing pattern 13' was shown to shift for explanation. In this configuration, the four corners of the reinforcing film patterns 13, 13' are "projected" from the reinforcing sheet 16 as viewed from the top of the reinforcing sheet 16. Further, part of the circuit pattern 12 connected to the IC chip 14 was overlapped on the reinforcing film pattern 13' on the non-mounted surface.

Example 3

Figure 12:
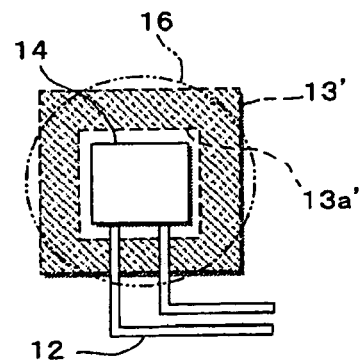
FIG. 12 is a plan view showing a form and configuration of a reinforcing film pattern in Example 3 and Example 11.

In the IC card in Example 3, there was used an IC module shown in FIG. 12 in which the reinforcing film pattern 13' was solely disposed on the IC chip 14 non-mounted surface. The configuration of the IC chip 14, the reinforcing sheet 16, and the reinforcing film pattern 13' is the same as that in Example 2.

Example 4

Figure 13:
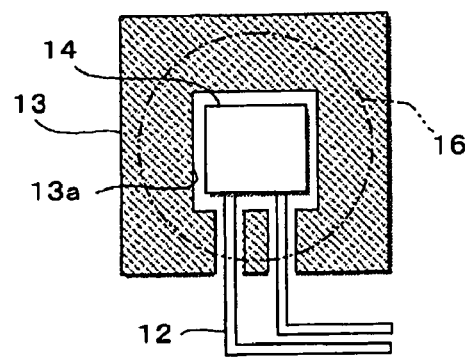
FIG. 13 is a plan view showing a form and configuration of a reinforcing film pattern in Example 4 and Example 12.

In the IC card in Example 4, there was used an IC module shown in FIG. 13 in which the reinforcing film pattern 13 was solely disposed on the IC mounted surface. In Example 4, the outer periphery form of the reinforcing film pattern 13 was an enlarged version of the one in Example 1 described with reference to FIG. 10 and other structure is the same as that in Example 2. Specifically, the reinforcing film pattern 13 was formed into a rectangle form having one side corresponding to a length longer than the diameter of the reinforcing sheet 16 by 2 mm, namely, 9 mm×9 mm rectangle form. Thus, whole of the outer periphery of the reinforcing film pattern 13 is "projected" from the reinforcing sheet 16 as viewed from the top of the reinforcing sheet 16.

Example 5

Figure 14:
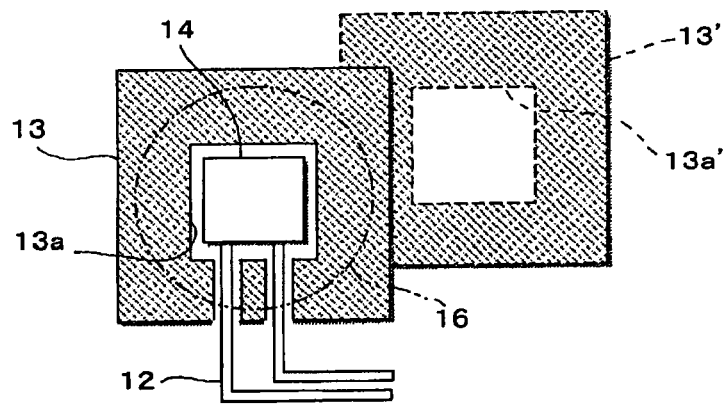
FIG. 14 is a plan view showing a form and configuration of a reinforcing film pattern in Example 5 and Example 13.

In the IC card in Example 5, there was used an IC module shown in FIG. 14 in which the reinforcing film patterns 13, 13' were respectively disposed on the IC mounted surface and the non-mounted surface. In Example 5, the outer periphery forms of the reinforcing film patterns 13, 13' were an enlarged version of the corresponding ones in Example 2 described with reference to FIG. 11 and other structure is the same as that in Example 2. That is, the outer periphery forms of the reinforcing film patterns 13, 13' are the same as that of the reinforcing film pattern 13 in Example 4.

Example 6

Figure 15:
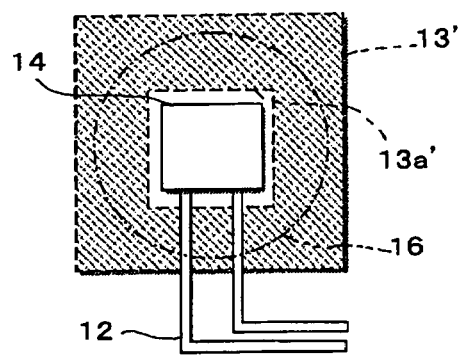
FIG. 15 is a plan view showing a form and configuration of a reinforcing film pattern in Example 6 and Example 14.

In the IC card in Example 6, there was used an IC module shown in FIG. 15 in which the reinforcing film pattern 13' was solely disposed on the IC chip 14 non-mounted surface. The configuration of the IC chip 14, the reinforcing sheet 16, and the reinforcing film pattern 13' is the same as that in Example 5.

Example 7

Figure 16:
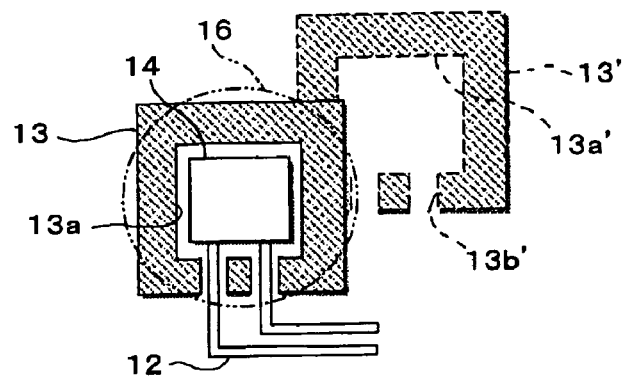
FIG. 16 is a plan view showing a form and configuration of a reinforcing film pattern in Example 7 and Example 15.

In the IC card in Example 7, there was used an IC module shown in FIG. 16 in which the reinforcing film patterns 13, 13' were respectively disposed on both of the IC mounted surface and the non-mounted surface. In Example 7, a bypass pattern 13*b*' was provided in the reinforcing film pattern 13' in Example 2 described with reference to FIG. 11 at a position in which the circuit pattern 12 was formed and other structure is the same as that in Example 2. Therefore, the circuit pattern 12 connected to the IC chip 14 was not overlapped on the reinforcing film pattern 13' on the non-mounted surface. The bypass pattern 13*b* had a width larger than that of the circuit pattern 12 by 0.3 mm.

Example 8

Figure 17:
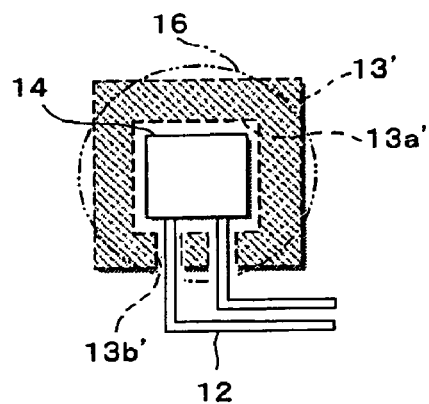
FIG. 17 is a plan view showing a form and configuration of a reinforcing film pattern in Example 8 and Example 16.

In the IC card in Example 8, there was used an IC module shown in FIG. 17 in which the reinforcing film pattern 13' was solely disposed on the IC chip 14 non-mounted surface. The configuration of the IC chip 14, the reinforcing sheet 16, and the reinforcing film pattern 13' is the same as that in Example 7.

Examples 9 to 16

In Examples 9 to 16, IC cards were individually produced using an IC module having the structure shown in FIG. 8 in which the reinforcing sheets 16, 16' were respectively provided on the IC mounted surface and the back surface. The different structures in Examples 9 to 16 from the corresponding ones in Examples 1 to 9 are that the reinforcing sheet 16' was provided also on the non-mounted surface, and other structures are the same. Specifically, in the IC card in each Example, the IC chip 14 and the reinforcing sheet 16 were arranged in the same manner as in Examples 1 to 8, and further the reinforcing sheet 16' having the same form as that of the reinforcing sheet 16 was disposed so that its center was aligned with the center of the reinforcing sheet 16. Further, in the IC card in each of Examples 9 to 16, the reinforcing film patterns 13, 13' having the forms in the corresponding Examples 1 to 8 were provided. The correspondences between the Examples and the figures for reference are shown below.

Example 9 . . . Example 1 (FIG. 10)
Example 10 . . . Example 2 (FIG. 11)
Example 11 . . . Example 3 (FIG. 12)
Example 12 . . . Example 4 (FIG. 13)
Example 13 . . . Example 5 (FIG. 14)
Example 14 . . . Example 6 (FIG. 15)
Example 15 . . . Example 7 (FIG. 16)
Example 16 . . . Example 8 (FIG. 17)

Example 17

Figure 18:
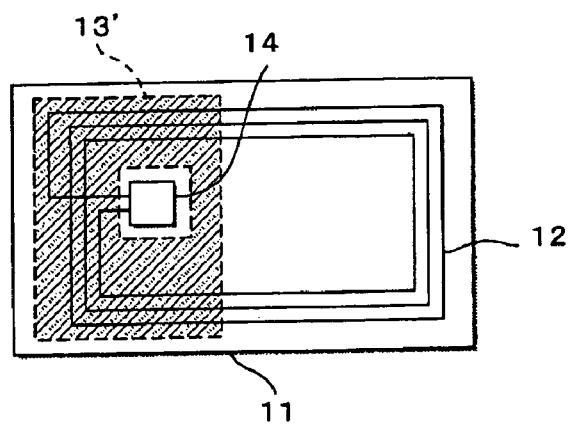
FIG. 18 is a plan view showing a form and configuration of a reinforcing film pattern in Example 17.

In Example 17, there was produced the same IC card as the IC card using an IC module having the structure shown in FIG. 2 in which the reinforcing sheet 16 was solely provided on the IC mounted surface, except that a reinforcing film pattern 13' having a larger area was disposed only on the IC non-mounted surface so that the reinforcing film pattern 13' was overlapped on an about ⅓ portion of the circuit pattern 12 on the IC mounted surface as shown in FIG. 18. The size of the reinforcing film pattern 13' was about ⅓ of that of the insulating substrate 11.

Examples 18 and 19

Figure 19:
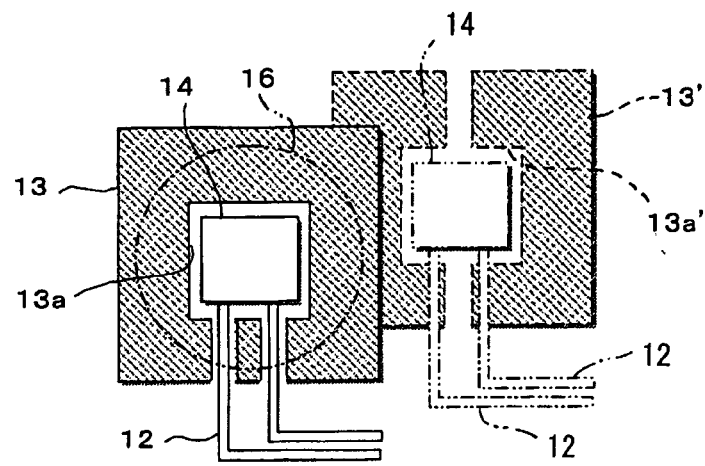
FIG. 19 is a plan view showing a form and configuration of a reinforcing film pattern in Example 18.
Figure 20:
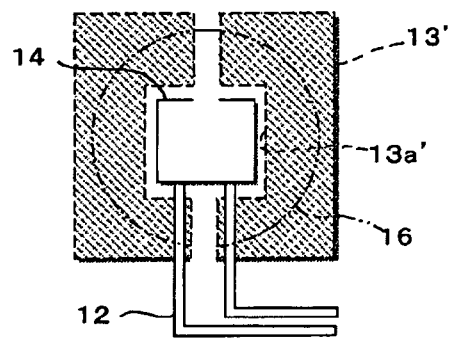
FIG. 20 is a plan view showing a form and configuration of a reinforcing film pattern in Example 19.

In these Examples, there were individually produced the same IC cards as the IC cards in Examples 13 and 14 described with reference to FIGS. 14 and 15, except that an IC module in which the reinforcing film pattern 13' on the non-mounted surface was divided into a plurality of portions was used. In these Examples, as shown in FIG. 19 and FIG. 20, the reinforcing film pattern 13' on the non-mounted surface was divided into two portions, i.e., a portion to be overlapped on the In-part of the circuit pattern 12 connected to the IC chip 14 and a portion to be overlapped on the Out-part of the circuit pattern 12. The correspondences between Examples 18 and 19 and Examples 13 and 14 and the figures for reference are shown below.

Example 18 . . . Example 13 (FIG. 19)
Example 19 . . . Example 14 (FIG. 20)

Comparative Examples 1 and 2

In Comparative Examples 1 and 2, IC cards having conventional structures were individually produced using IC modules in which the reinforcing film patterns 13, 13' were not provided. Specifically, in Comparative Example 1, an IC card in which the reinforcing sheet 16 was solely provided on the IC mounted surface was produced, and, in Comparative Example 2, an IC card in which the reinforcing sheets 16, 16' were respectively provided on the IC mounted surface and the non-mounted surface was produced.

Comparative Examples 3 to 5

Figure 21:
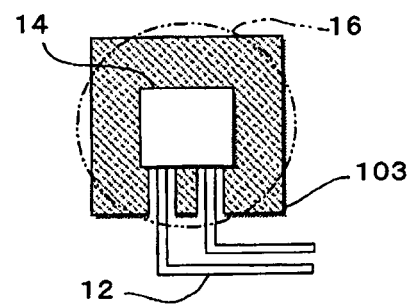
FIG. 21 is a plan view showing a form and configuration of a reinforcing film pattern in Comparative Example 3 and Comparative Example 6.
Figure 22:
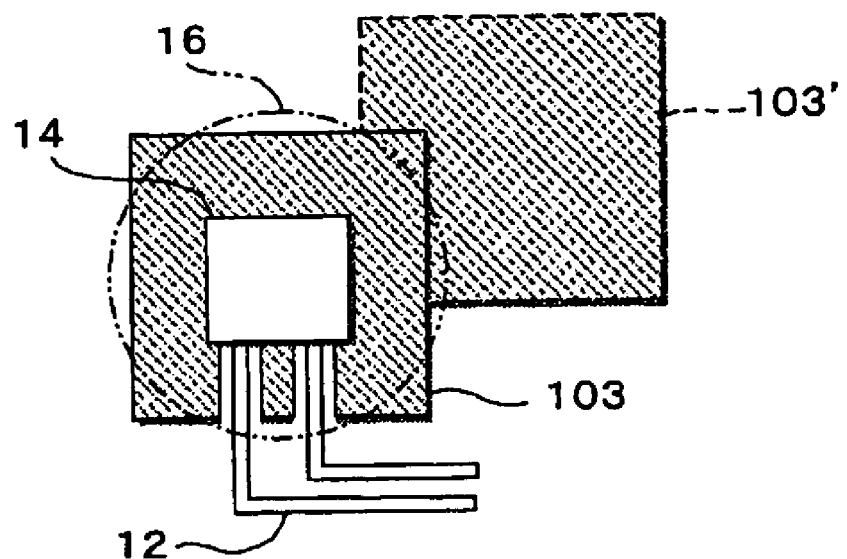
FIG. 22 is a plan view showing a form and configuration of a reinforcing film pattern in Comparative Example 4 and Comparative Example 7.
Figure 23:
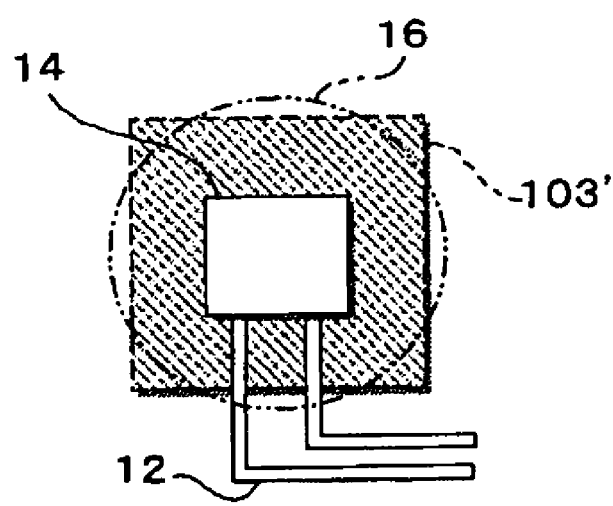
FIG. 23 is a plan view showing a form and configuration of a reinforcing film pattern Comparative Example 5 and Comparative Example 8.

In Comparative Examples 3 to 5, IC cards were individually produced using an IC module having the structure shown in FIG. 2 in which the reinforcing sheet 16 was solely provided on the IC mounted surface. It is noted that, in the IC card in each Comparative Example, reinforcing film patterns 103, 103' having no opening in the IC chip mounted portion were provided as shown in FIGS. 21 to 23. Further, the reinforcing film patterns 103, 103' in Comparative Examples 3 to 5 are provided in the outer periphery forms and configurations respectively corresponding to those in Examples 1 to 3. The correspondences between Examples 1 to 3 and Comparative Examples 3 to 5 and the figures for reference are shown below.

Comparative Example 3 . . . Example 1 (FIG. 21)
Comparative Example 4 . . . Example 2 (FIG. 22)
Comparative Example 5 . . . Example 3 (FIG. 23)

Comparative Examples 6 to 8

Comparative Examples 6 to 8 are examples of the IC card having the structure shown in FIG. 8 in which the reinforcing sheets 16, 16' were respectively provided on the IC mounted surface and the non-mounted surface, using an IC module in which the reinforcing film patterns 103, 103' having no opening in the IC chip mounted portion were provided. The reinforcing film patterns 103, 103' in each of Comparative Examples 6 to 8 are provided in the outer periphery forms and configurations respectively corresponding to those in Examples 1 to 3. The correspondences between Examples 1 to 3 and Comparative Examples 6 to 8 and the figures for reference are shown below.

Comparative Example 6 . . . Example 1 (FIG. 21)
Comparative Example 7 . . . Example 2 (FIG. 22)
Comparative Example 8 . . . Example 3 (FIG. 23)

In the IC card in each of Comparative Examples 3, 4, 6, and 8 in which the reinforcing film pattern 103 was provided on the IC mounted surface, the reinforcing pattern 103 was provided so that it integrated with the supporting pattern 18 for supporting the IC chip 14 (see FIG. 2).

Next, the procedure for producing the IC cards in the above Examples and Comparative Examples is described below.

① First, an IC module was produced as follows.

An aluminum foil (20 μm) was applied to the IC mounted surface of an insulating substrate 11 comprised of polyethylene terephthalate (thickness=50 μm) to form a resist pattern in the aluminum foil. Then, the aluminum foil was etched using the resist pattern as a mask to form a circuit pattern 12 comprised of aluminum on the polyethylene terephthalate and a reinforcing film pattern 13 and a supporting pattern 18 for the IC chip 14 which were not in contact with the circuit pattern 12. In the Comparative Examples, a reinforcing film pattern 103 was formed. Further, when a reinforcing film pattern 13' was formed on an IC non-mounted surface, the same procedure was conducted to form the reinforcing film pattern 13' comprised of aluminum (reinforcing film pattern 103') having an individual form. Thus, an antenna module (flexible printed board) having the circuit pattern 12 formed on the insulating substrate 11 was prepared.

An IC chip (length: 4 mm×width: 4 mm×thickness: 180 μm) 14 was mounted by face down bonding on the antenna module through an anisotropic conductive adhesive layer 17, and the IC chip 14 was sealed by an epoxy sealing resin 15 and a reinforcing sheet 16 was placed above the resin. Then, the sealing resin 15 was cured at 100° C. On the other hand, when a reinforcing sheet 16' was provided on the IC non-mounted surface, the reinforcing sheet 16' was provided on the non-mounted surface of the insulating substrate 11 through a sealing resin 15', and then the sealing resin 15' was cured at 100° C. Thus, an IC module 1 was produced. As the reinforcing sheets 16, 16', a sheet obtained by shaping SUS304H specified in JIS so as to have a thickness of 50 μm was used.

② Subsequently, a card substrate was produced as follows.

Front and back end thermoplastic sheets (thickness=280 μm) 21, 21' comprised of PET-G (copolymer of terephthalic acid, cyclohexanedimethanol, and ethylene glycol) having white filler (titanium oxide) mixed thereinto were prepared. The IC module 1 previously prepared was disposed between the thermoplastic sheets 21, 21', and the four corners of the thermoplastic sheets 21, 21' were melted by means of an ultrasonic bonding machine to temporarily fix them together. Then, oriented polypropylene (OPP) film sheets were placed on both surfaces of the sheets temporarily fixed, and they were together disposed between stainless steel mirror plates (thickness=3 mm) and melted by means of a hot-melt press under conditions such that the temperature was 170° C. and the pressing pressure was 15kg/cm2 , and then solidified by cooling and the OPP sheets were peeled off to obtain a card substrate 2 having the IC module 1 sealed therein.

③ Further, printed sheets were produced as follows.

Patterns for front and back surfaces were individually printed on sheets comprised of polyethylene terephthalate (thickness=100 μm) by silk printing/offset printing, and an adhesive coating composition shown below was applied to the back surface of each of the resultant printed sheets by a gravure printing method so that the thickness of the composition applied became 3 μm, and dried at a drying temperature of 100° C. Thus, a printed sheet for front surface and a printed sheet for back surface were produced.

| <Formulation of adhesive coating composition> | |
|---|---|
| Polyester resin | 40 Parts by weight |
| Toluene | 50 Parts by weight |
| Methyl ethyl ketone | 50 Parts by weight |

④ In addition, a reversible recording sheet was prepared.

As a reversible recording sheet, a lueco thermal recording sheet (manufactured and sold by MITSUBISHI PAPER MILLS LIMITED; product name: TRF33) was prepared. The thermal recording sheet has a structure such that a base material comprised of polyethylene terephthalate has a thickness of 25 μm, a recording layer provided on the base material has a thickness of 7 μm, and a protecting layer for the recording layer has a thickness of 3 μm.

⑤ The individual members were produced as described above, and then a card was formed using them as follows.

First, the printed sheet for front surface obtained in ③ was disposed on the card substrate 2 produced in ② on the thermoplastic sheet 21 side (IC mounted surface side), and the printed sheet for back surface obtained in ② was disposed on the thermoplastic sheet 21' side (non-mounted surface side). Each printed sheet was disposed so that the printed surface was outside. Then, the reversible recording sheet obtained in ② was disposed on the printed sheet for front surface so that the protecting layer was outside. The resultant laminate was temporarily fixed again by means of an ultrasonic bonding machine. Oriented polypropylene film sheets were placed on both sides of the sheets temporarily fixed, and they were together disposed between stainless steel mirror plates (thickness=3 mm), and melted by means of a vacuum hot-melt press under conditions such that the temperature was 120° C. and the pressing pressure was 15 kg/cm², and then solidified by cooling, followed by punching out into a card form, thus producing IC cards in the Examples and Comparative Examples, in which the reversible recording layer 3 was provided on the card substrate 2.

⑤ Evaluation

Using the thus produced IC cards in Examples 1 to 19 and Comparative Examples 1 to 8 as samples for evaluation, the printing properties for the reversible recording layer 3, the communication characteristics, and the IC strength were evaluated as follows. The results of the evaluations are shown in Table 1 above.

<Printing Properties>

With respect to the reversible recording layer 3, printing was conducted using a thermal printer (KUZ), manufactured and sold by Kyushu Matsushita Electric Co., Ltd., at energy applied to a thermal head of 0.55 mJ/dot. In the portion of the reversible recording layer 3 on the IC chip mounted portion, when print missing occurred, the printing properties were rated X; when slight touching occurred on the printed portion, the printing properties were rated Δ; and, when no print missing occurred, the printing properties were rated o.

<Communication Characteristics>

Using a communication distance between a reader/writer and an IC card as a factor, the IC card operation was examined using a reader/writer (communication device), manufactured and sold by Sony Corporation, to measure a maximum communication distance, and the distance measured was taken as communication characteristics.

<IC Strength>

A load (static load strength) applied until the IC chip was broken on the IC chip mounted portion was evaluated. The position to which a load was applied was the center of the IC chip mounted portion, the tip of a gage head had a form of sphere having a radius of 0.2 mm, and the loading speed was 0.5 mm/min, and the breakage of the IC chip was evaluated in terms of a point in time when the communication was impossible; In the examination of the IC operation, a reader/writer (communication device), manufactured and sold by Sony Corporation, was used.

As a result of the above evaluations, it has been confirmed that, in the IC card in each of Examples 1 to 19, i.e., the IC card having the reinforcing film patterns 13, 13' having openings in which the IC chip 14 is mounted, the printing properties for the reversible recording layer 3 are rated Δ or o and kept in good condition. Especially in Examples 2, 5, 7, 10, 13, and 15 in which the reinforcing film patterns 13, 13' were respectively provided on both of the IC mounted surface and the non-mounted surface, and in Examples 4, 6, 12, and 14 in which the reinforcing film pattern 13 or 13' having a size sufficient to be cover the reinforcing sheets 16, 16' was provided on one surface, it has been confirmed that very good printing properties (o) such that no slight touching occurred on the printed portion can be secured.

By contrast, in the conventional IC card in each of Comparative Examples 1 and 2 in which no reinforcing film pattern was provided like the conventional way, and in the IC card each of Comparative Examples 3 to 8 in which the reinforcing film patterns 103, 103' having no opening in which the IC chip is mounted were provided, print missing occurred (printing properties: X) and the printing properties could not be kept in good condition.

Further, among Examples 1 to 19, in Examples 1, 4, 9, and 12 in which no reinforcing film pattern was provided on the non-mounted surface and there was no portion of the reinforcing film pattern overlapped on the circuit pattern 12, and in Examples 7, 8, 15, and 16 in which the reinforcing film pattern 13' was provided on the non-mounted surface, but there was no portion of the reinforcing film pattern 13' overlapped on the circuit pattern 12, it has been confirmed that communication characteristics equivalent to those obtained in Comparative Examples 1 and 2 as conventional technique examples can be secured. In addition to the above results, in Example 17 in which the portion of the reinforcing film pattern 13' on the non-mounted surface overlapped on the circuit pattern 12 was larger, communication characteristics cannot be obtained. From these results, it has been confirmed that, when the reinforcing film pattern 13' on the non-mounted surface is comprised of a conductive material, by reducing the portion of the reinforcing film pattern 13' overlapped on the circuit pattern 12, the communication characteristics can be kept in better condition.

In addition, among Examples 1 to 19, in Examples 18 and 19 in which the reinforcing film pattern 13' on the non-mounted surface was divided per portion to be overlapped on the circuit pattern 12, it has been confirmed that communication characteristics equivalent to those obtained in Comparative Examples 1 and 2 as conventional technique examples can be secured. From this result, it has been confirmed that, when the reinforcing film pattern 13' on the non-mounted surface is comprised of a conductive material, by dividing the reinforcing film pattern 13' per portion to be overlapped on the circuit pattern 12, the communication characteristics can be kept in better condition.

Further, the IC strength in Examples 1 to 8, in which the reinforcing sheet 16 was solely provided on the mounted surface, is at a level equivalent to that of the IC strength (static load strength) in Comparative Example 1, in which the reinforcing sheet was solely provided similarly on the mounted surface, and thus, it has been confirmed that the IC strength is not lowered due to the reinforcing film patterns 13, 13' provided and the protection of the IC chip 14 by the reinforcing sheet 16 is kept.

Further, the IC strength in Examples 9 to 16, in which the reinforcing sheets 16, 16' were respectively provided on the mounted surface and the non-mounted surface, is at a level equivalent to that of the IC strength (static load strength) in Comparative Example 2, in which the reinforcing sheets were similarly provided on the respective surfaces, and thus, it has been confirmed that the IC strength is not lowered due to the reinforcing film patterns 13, 13' provided and the protection of the IC chip 14 by the reinforcing sheets 16, 16' is kept.

As described above, in the IC card of the present invention, by providing a reinforcing film pattern on both of the insulating substrate for the IC module, deformation of the reinforcing sheet provided on the IC chip can be suppressed and flatness of the surface including portions around the IC chip mounted portion can be secured. Therefore, in the IC card in which the IC chip is protected by the reinforcing sheet to improve the reliability, printing properties for the reversible display layer provided on the surface of the substrate can be improved.

The invention claimed is:

1. An IC card comprising:

an IC module which comprises an IC chip mounted on an insulating substrate, a sealing resin encapsulating said IC chip on said insulating substrate such that said sealing resin provides a protective encapsulation about said IC chip, and a reinforcing sheet provided over said IC chip with said sealing resin therebetween;

a card substrate comprised of a resin within which said IC module is sealed; and a reversible display layer provided on at least one surface of said card substrate, wherein, said card substrate has a surface flatness suitable for printing with respect to said reversible display layer, said IC chip module includes a reinforcing film pattern between said IC chip and said insulating substrate having an opening which exposes at least a portion of said IC chip facing said insulating substrate, an outer periphery of the reinforcing film pattern on the IC chip side of the insulating substrate is larger than an outer periphery of the reinforcing sheet, and the opening of the reinforcing film pattern is smaller than the outer periphery of the reinforcing sheet.

2. The IC card according to claim 1, characterized in that at least part of an outer periphery of said reinforcing film pattern is located outside an outer periphery of said reinforcing sheet.

3. The IC card according to claim 1, characterized in that said insulating substrate has a reinforcing sheet provided on said non-mounted surface through an adhesive at a position corresponding to said IC chip mounted portion.

4. The IC card according to claim 1, characterized in that said insulating substrate has a circuit pattern formed on said mounted surface, wherein said reinforcing film pattern provided on said mounted surface is comprised of the same material as that for said circuit pattern.

5. The IC card according to claim 1, characterized in that said insulating substrate has a circuit pattern formed on said IC chip mounted surface, wherein said reinforcing film pattern provided on said mounted surface of said insulating substrate is comprised of a conductive material and has a form such that no portion is overlapped on said circuit pattern.

6. The IC card according to claim 1, characterized in that said insulating substrate has a circuit pattern formed on said IC chip mounted surface, wherein said reinforcing film pattern provided on said non-mounted surface of said insulating substrate is comprised of a conductive material and divided into a plurality of portions per portion to be overlapped on said circuit pattern.

7. The IC card according to claim 1, characterized in that said reinforcing film pattern is comprised of an insulating material.

* * * * *